United States Patent [19]

Kabaya et al.

[11] 3,894,893

[45] July 15, 1975

[54] METHOD FOR THE PRODUCTION OF MONOCRYSTAL-POLYCRYSTAL SEMICONDUCTOR DEVICES

[75] Inventors: Yoshihiko Kabaya, Zama-machi; Heishichi Ikeda, Sagamihara, both of Japan

[73] Assignee: Kabushiki Kaisha Kyodo Denshi Gijyutsu, Japan

[22] Filed: July 23, 1971

[21] Appl. No.: 165,091

Related U.S. Application Data

[63] Continuation-in-part of Ser. No. 811,032, March 27, 1969, abandoned.

[30] Foreign Application Priority Data

June 26, 1968 Japan ............ 43-44300
Mar. 30, 1968 Japan ............ 43-20899

[52] U.S. Cl. ............ 148/175; 117/106 A; 117/201; 117/212; 117/213; 148/174; 357/40; 357/48; 357/50; 357/59

[51] Int. Cl. ............ H01l 7/36; H01l 29/04

[58] Field of Search ............ 148/1.5, 174, 175, 187; 317/234, 235; 117/106 A, 201, 212, 213

[56] References Cited

UNITED STATES PATENTS

| | | | |
|---|---|---|---|
| 3,418,181 | 12/1968 | Robinson | 148/187 |
| 3,456,169 | 7/1969 | Klein | 317/235 |
| 3,463,715 | 8/1969 | Bloom | 148/174 UX |
| 3,475,661 | 10/1969 | Iwata et al. | 317/234 |
| 3,500,139 | 3/1970 | Frouin et al. | 317/235 |
| 3,506,545 | 4/1970 | Garwin et al. | 317/235 UX |
| 3,519,901 | 7/1970 | Bean et al. | 317/235 |
| 3,529,347 | 9/1970 | Ingless et al. | 317/235 X |
| 3,558,374 | 1/1971 | Boss et al. | 148/174 |
| 3,607,466 | 9/1971 | Miyazaki | 148/175 |
| 3,607,699 | 9/1971 | Sosniak | 317/235 UX |
| 3,617,822 | 11/1971 | Kobayashi | 317/235 |
| 3,624,467 | 11/1971 | Bean et al. | 317/235 |

*Primary Examiner*—L. Dewayne Rutledge
*Assistant Examiner*—W. G. Saba
*Attorney, Agent, or Firm*—Robert E. Burns; Emmanuel J. Lobato; Bruce L. Adams

[57] ABSTRACT

A method for the production of a semiconductor device which is adapted to be utilized in integrated circuits, said device being composed of a plurality of polycrystalline regions and monocrystalline regions epitaxially grown on a substrate so that, between each of the two kind of regions, at least one monocrystal-to-polycrystal junction is formed, whereby the conventional diffusion-type isolating process which is difficult in practice can be completely eliminated. In each of the above described monocrystalline regions, various circuit elements such as a transistor, capacitor, and resistor are formed, and these circuit elements are electrically insulated from each other by means of the monocrystal-to-polycrystal junction thus formed, whereby production of the semiconductor device is much simplified, and the insulation resistance for each of the circuit elements is much improved.

1 Claim, 7 Drawing Figures

INVENTOR

BY

ATTORNEY

METHOD FOR THE PRODUCTION OF MONOCRYSTAL-POLYCRYSTAL SEMICONDUCTOR DEVICES

CROSS-REFERENCE TO RELATED APPLICATION

This application is a continuation-in-part of our co-pending application Ser. No. 811032, filed Mar. 27, 1969, entitled "SEMICONDUCTOR DEVICE" and now abandoned.

BACKGROUND OF THE INVENTION

This invention relates generally to the field of semiconductor devices, and more particularly to a method for the production of semiconductor devices adapted to be utilized in the production of integrated circuits and to the semiconductor devices themselves.

Various types of semiconductor devices adapted to be utilized in the production of integrated circuits are known, and a typical example of the conventional method for obtaining such devices comprises the steps of epitaxially growing an N-type layer on a P-type semiconductor substrate; forming a P-type diffusion layer having a plurality of ring-configurations on the N-type layer by means of a selective diffusion process which is continued until the bottom portions of the P-type diffusion layer reach the P-type substrate, whereby a required number of confined regions surrounded by the ring-configurated P-type diffusion layer and also by the P-type substrate are obtained on the epitaxially grown N-type layer; and forming a circuit element such as a transistor, diode, resistor, or a capacitor in each of the confined regions.

However, in such construction of the conventional semiconductor devices applicable to integrated circuits, there has been a drawback in that the insulation of the PN junction used for isolating each of the confined portions including a circuit element is not sufficiently high because of a high concentration of P-type impurities in the P-type diffusion layer.

Furthermore, the isolation diffusion process has required a considerably long period of time, for instance, from several hours to several tens of hours, and the production efficiency of the semiconductor devices was deleteriously low.

In addition, the thickness of the epitaxial layer could not be made uniform, and, even in the same semiconductor wafer, there were portions where the isolation diffusion was not completed. Moreover, where an isolation layer of different thickness is required on each of different semiconductor wafers, the above described diffusion period must be varied for each of the wafers. Furthermore, in the case of conventional methods, when epitaxial growth is caused on buried layer as well-known, pattern of the buried layer cannot be reproduced on the position just above the surface of the epitaxial layer unless sectional surface of crystal face of the substrate is correctly controlled so as to have an angle from 1° to 3° with respect to a certain specific crystal face, for instance, to face <III>, thus causing impossibility of mask-matching adapted to succeeding diffusion of base and emitter.

On the other hand, the conventional dielectric isolation method or isolation method utilizing the dielectric isolation and an pn junction have very excellent characteristics, but they have not yet been practically used, because said methods necessitate so-called abrading or etching process causing limitation of utilization of said methods within a particular use-fields and further causing increase of number of the process steps.

SUMMARY OF THE INVENTION

Therefore, the primary object of the present invention is to provide a novel method for the production of semiconductor devices which are adapted to be utilized in the production of integrated circuits and to new semiconductor devices produced by said method, whereby all of the above described drawbacks can be substantially overcome.

Another object of the invention is to provide a novel construction of semiconductor devices and a method for obtaining such construction, wherein the insulating resistance between the circuit elements is much improved.

Still another object of the invention is to provide a novel type of semiconductor device, wherein a polycrystalline layer is formed on a selected part of the semiconductor substrate on which a P-type isolation diffusion layer is employed in the conventional construction.

An additional object of the invention is to provide a novel method for the production of a novel and construction of semiconductor devices, wherein polycrystalline regions and monocrystalline regions are simultaneously formed on a semiconductor substrate, and various circuit elements are formed in each of the monocrystalline regions.

A further object of this invention is to provide a novel method for producing the above described construction of semiconductor devices, whereby the production of the semiconductor devices is much facilitated, and the time required is much shortened.

These and other objects of the present invention have been achieved by a novel method for the production of a semiconductor device having both-directional high breakdown voltage established between mono- and poly-crystalline regions, said method comprising steps of coating an insulator film on a part of a semiconductor substrate of one conductivity type; carrying out simultaneous growth of monocrystal and polycrystal in the same reactor or reactor tube so as to produce said polycrystal on said film and said monocrystal on the portion of said substrate, having no said film, said reactor or reactor tube containing one impurity capable of imparting a reverse conductivity opposite to that of said substrate whereby said mono- and polycrystals are doped with the same impurity; and then providing electrodes on said monocrystalline and polycrystalline regions, without carrying out doping into the junction between poly-mono-crystals.

A novel semiconductor device according to the invention comprises, more particularly, a semiconductor substrate of one conductivity type; a plurality of monocrystalline regions of opposite conductivity type epitaxially grown in spaced relation on said substrate; polycrystalline region means grown simultaneously on said substrate with said monocrystalline regions and each said region having one impurity doped therein during growth, said polycrystalline region being disposed between said monocrystalline regions and in contact with said monocrystalline regions for providing respective monocrystal-to-polycrystal junctions which are free of any intentional impurity other than said principal impurity doped therein during growth; and a plurality of electronic circuit elements provided, respectively, within said monocrystalline regions, wherein one said element within one said monocrystalline region is electrically insulated from another said element within another said monocrystalline region by the poly-mono-junction at their side faces and their bottom PN junctions, and whereby said junctions exhibit a high voltage breakdown characteristic in both polarity directions.

The invention also provides a novel method for obtaining the above described construction of the semiconductor device, which comprises the steps of: forming selectively a region prohibiting growth of a monocrystalline layer on a semiconductor substrate; simultaneously growing from vapor phase generally a plurality of polycrystalline regions and monocrystalline regions on the semiconductor substrate so that the two regions are contiguous to each other and have a monocrystal-to-polycrystal junction formed therebetween; heat-treating said monocrystal-to-polycrystal junction thereafter; and forming a circuit element in each of said monocrystalline region, whereby each of the circuit element is insulated from other circuit elements by the monocrystal-to-polycrystal junction or junctions. Of course, in the state prior to the above-mentioned heat treatment the isolation is almost established, but said heat treatment causes a decrease of any leakage current, whereby a complete isolation is secured.

The invention will be more fully understood from the following description with respect to a preferred embodiment thereof when read together with the accompanying drawings.

DETAILED DESCRIPTION OF THE INVENTION

Figure 1:
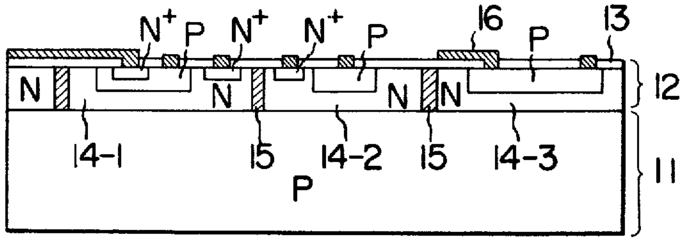
FIG. 1 is a schematic sectional view showing an example of a semiconductor device according to the present invention applied to an integrated circuit.

Referring first to FIG. 1 which illustrates an example of a semiconductor device according to the present invention and applicable to an integrated circuit, there are indicated a P-type semiconductor substrate 11 (first region of the device), a layer 12 grown from a vaporized phase on the P-type substrate (second region of the device), and an insulating and protecting layer 13 formed on the layer 12. In the second region 12, a plurality of N-type layer portions 14-1, 14-2, 14-3 of monocrystal and polycrystalline portions 15 separating these layer portions from each other are provided, and in these N-type layer portions 14-1, 14-2, 14-3, which are surrounded by the polycrystalline semiconductor portions 15 and the P-type substrate 11, each of the desired semiconductor circuit elements are formed. For instance, in the layer portion 14-1, a transistor may be formed, and in the portions 14-2 and 14-3, there may be formed a diode and a resisotr, respectively. Electrodes 16 are also provided for these circuit elements.

It should be noted that an important feature of the present invention is that the bottom surfaces of the N-type layer portions 14-1, 14-2, 14-3 are electrically isolated by the PN junction between the layer portions and the P-type substrate located underneath each of these layer portions, and the side surfaces thereof are isolated by the electrically insulating nature of the polycrystalline portions 15 surrounding the side surfaces of the layer portions 14-1, 14-2, 14-3.

A typical method for producing a semiconductor integrated circuit in which a semiconductor device according to the present invention is used will now be described with reference to FIGS. 2(A), 2(B), and 2(C).

Figure 2A:
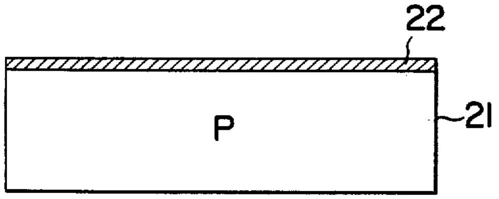
FIGS. 2(A), 2(B), and 2(C) are schematic cross sectional views indicating a process for producing a semiconductor device according to the invention.

On a P-type silicon substrate 21, in FIG. 2(A), having a specific resistance of approximately 3 ohms, a silicon dioxide layer 22 of about 5000-Angstrom thickness is formed by a thermal oxidation process.

Figure 2B:
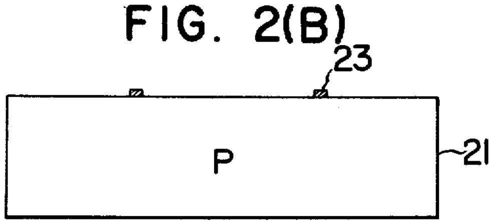

The silicon dioxide layer 22 is applied by a photoresisting method, and a greater part of the layer 22 is etched away, so that merely some of ring-formed portions of the silicon dioxide layer 22 are left behind (see FIG. 2(B) ).

Figure 2C:
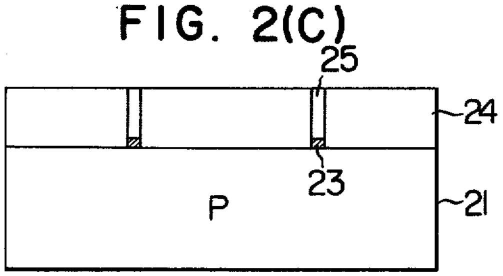

Then, an N-type layer 24 is formed on the whole surface of the above described substrate, on which ring-shaped portions of silicon dioxide layer are partly left behind, utilizing the well known "vapor-phase growing method", thereby to form an N-type layer 24 of about 7-micron thickness and about one ohm cm resistivity (see FIG. 2(C) ).

At this time, the N-type layer 24 formed on a portion of the substrate having no silicon dioxide will be of monocrystalline layer epitaxially grown directly on the P-type semiconductor substrate, and a part of said N-type layer 24 formed on another portion of the substrate having silicon dioxide left behind will be of polycrystalline layer 25 of about 10 ocm cm resistivity. The junction portions thus formed between the N-type monocrystalline portions and the ring-shaped polycrystalline layer 25 is found to have a voltage-current characteristic as shown in FIG. 3.

The reason thereof will be described as follows. Namely, according to the invention, as clear from the above-mentioned fact, polycrystal and monocrystal are simultaneously grown and the reactions therefore are carried out in the same reactor or reactor tube, so that donor-impurity forming N-type is doped in both crystals. However, in this invention it has been found the fact that there is characteristic shown in FIG. 3 between the poly- mono-crystals which have been simultaneously grown and been doped with the same impurity. This fact had not been thought of at all prior to the invention. On the contrary, hereto, under utilization of the fact that the impurity diffusion speed at a simultaneously grown polycrystal is large, an impurity imparting a conductivity opposite to that of the impurity at growth time is diffused, through the poly layer and over the junction between the poly- mono-crystals, into the mono layer, and PN junction is formed in the mono crystal positioned in the vicinity of the poly layer, whereby PN isolation is established. However, according to the invention, isolation terminates upon completion of epitaxial growth, so that the process becomes very simple.

Figure 3:
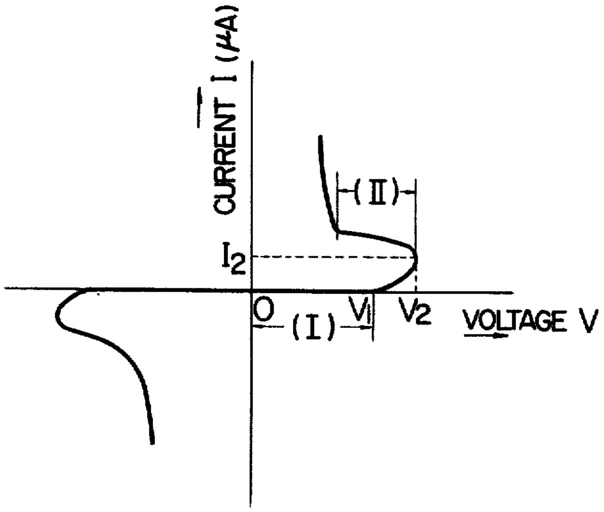
FIG. 3 is a graphical representation showing the voltagecurrent characteristic of a monocrystal-to-polycrystal junction formed according to the invention.

The characteristic curve shown in FIG. 3 is bidirectional and the positive side of the abscissa represents the case where a positive voltage is applied to the polycrystalline layer 25.

The leakage current through the junction is maintained less than one micro-ampere within a range designated by "I", and the yielding voltage V1 exists at a voltage as high as from 80 to 100 V. Furthermore, a secondary yielding voltage V2 exists at a higher voltage than the V1, and after that the characteristic is shifted into a negative resistance region "II". The voltage V2 is approximately 110 to 120 V, and the current $I_2$ at this voltage is about 5 to 10 mA. The characteristic in the reverse direction is similar to the above described characteristic in the waveform V-1, but is different in the value of BV. For example, there is a difference of about 20 V between the cases of positive and negative crystals. This difference has been conformed in the course of experiments of the invention, and the more the impurity core of the growth layer becomes large (specific resistance becomes small), the more said difference becomes large.

In contrast to this characteristic, the conventional isolation barriers made of PN junctions diffused by boron on an epitaxially grown N-type layer of an equivalent thickness and an equivalent specific resistance, which is formed on a P-type substrate of an equivalent specific resistance to the above described example, have a break-down voltage of approx. 25 V.

However, it should be noted that for the purpose of obtaining the above described insulation characteristic of the junction portions, the wafer on which the N-type layer 24 is formed from the vaporized phase is thereafter subjected to a heat-treatment for a certain period at a temperature of approximately from 700°C to 1,300°C in an atmosphere of mixed gas consisting of water vapor and oxygen or in an atmosphere of mere oxygen or nitrogen. By this heat-treatment, the leakage current through the junction portions is decreased, and the break-down voltage thereof can be greatly elevated.

Furthermore, on this completed surface of the wafer, a glass containing semiconductor oxide and boron, phosphorous or lead compound (for instance, boron silicate glass, or phosphor-silicate glass) may be coated, this procedure being advantageous for improving the insulating resistance of the junction portions and also for preventing deterioration of the same portions.

Figure 4:
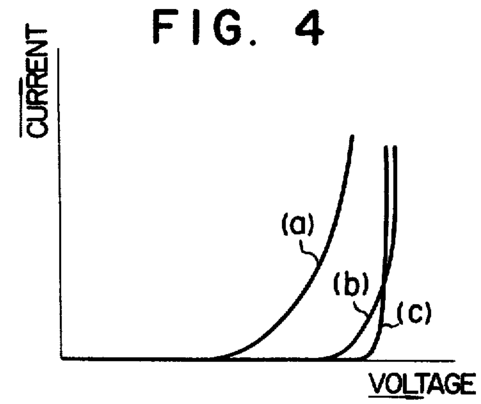
FIG. 4 is a graphical representation showing various voltagecurrent characteristics of the same junction when the semiconductor device according to the invention is heat-treated and coated by a glass having a Gettering effect.

FIG. 4 illustrates advantageous effects imparted to the insulating characteristics of the junction portions by the above described coated glass such as boron-silicate glass or phosphor-silicate glass and the previously described heat-treatment, said glass effecting a Gettering action (action of sucking out unfavorable impurities such as Cu, Au, etc. from the interior of the semiconductor). The curves (a), (b), and (c) indicate the insulation characteristics before the heat-treatment, after the heat-treatment and after coating of the glass effecting the Gettering effect with respect to Cu, Fe, and Au, respectively.

As described before, when an isolation diffusion of about 20-micron width is performed in the conventional PN junction isolated devices, the width of the isolation layer at the exposed surface of the device is expanded to about 50 microns, occupying a considerable portion of the entire surface of the semiconductor device. According to the present invention, the isolation of each of the monocrystalline portions can be achieved by polycrystalline layers of about 10-micron width, and much improved miniaturization of the integrated circuits can be thereby realized. When this miniaturization was calculated exemplarily for the case of a transistor-transistor logic (TTL) circuit, it was found that about 30 % of the surface area can be economized.

Furthermore, in the conventional semiconductor devices wherein an N-type layer was grown from vapor phase on a P-type substrate having a buried layer, there was a drawback such that correct alignment of the masking for obtaining, for instance, a transistor just above the buried layer was difficult because of the deviation between the actual portion on the surface corresponding to the buried layer and the physically upward position of the buried layer.

According to the present invention, this difficulty is eliminated, because the polycrystalline layer always grows exactly upward from the silicon dioxide layer, and the error in mask-aligning in the conventional devices can be prevented.

Furthermore, creation of a channel between the substrate and the insulating layer can be prevented by a minor procedure such as increasing beforehand the density of the impurity at that portion or applying beforehand impurity of high density on the insulating layer.

In the semiconductor technique (for example, DOO Patents: U.S. Pat. Nos. 3335038, 3386865) similar to that of the present invention, the following steps are necessary.

Epitaxial growth by using a $SiO_2$ layer as a mask; Poly growth; abrading or etching of polycrystal; and diffusion adapted to form elements.

Accordingly, it will be confirmed that extremely difficult steps such as mask epitaxial growth and abrading or etching are necessary, and it is impossible to discriminate epitaxial Si and poly Si in the etching step, that is, to stop the etching at the poly epitaxial surface in order to expose the epitaxial layer surface. Furthermore, abrading is not simple and easy step, and when poly surface is polished, it becomes impossible to discriminate said poly-crystal surface from mono-crystal surface. On the contrary, in the invention of this application, the necessary steps are only the following steps:

1. Simultaneous growth of poly- and mono-crystals by utilizing $SiO_2$ as the seed of poly-crystals.
2. Diffusion adapted to form elements.

Accordingly, steps become very simple, dangling and ragged portions (produced in mask epitaxial step) of the epitaxial layer edge will not occur, and the abrading or etching steps becomes unnecessary.

Furthermore, even if the so-called ghost phenomenon being a problem in integrated circuits, occurs in the time of epitaxial growth, polycrystal grows on the $SiO_2$ seed in the direction perpendicular to the surface, so that correct positioning becomes possible by carrying out mask-positioning by means of adopting said poly-crystal as a discriminating mark (which can be easily discriminated from the monocrystal). In the conventional case, diffusion mask-positioning of the base at the correct position on the base layer is impossible, but if there is an easily discriminatable polycrystal as in the case of the present invention, said mask-positioning becomes easy. Furthermore, in the case of mask epitaxial, form of the edge of a layer having been grown per wafer differs remarkably in accordance with flowing direction and off angle deviated from crystal orientation of the growth-like reaction gas, so that even if discrimination is possible as in the case of polycrystal, it cannot be a mark adapted for the mask-positioning.

The most important feature of the invention resides in that a barrier or extremely excellent barrier exists between n monocrystal and simultaneously grown n polycrystal.

Figure 5:
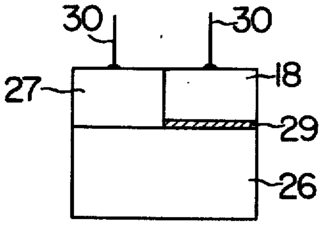
FIG. 5 is a diagram schematically illustrating an example, wherein the semiconductor device according to this invention is employed as a bipolar semiconductor element.

FIG. 5 illustrates a bipolar circuit element of negative resistance, which is also an example of application of this invention. In the drawing, there is indicated a P-type monocrystalline substrate 26, on which a N-type monocrystalline layer 27 and a polycrystalline layer 28 are grown. It is seen that a silicon dioxide layer 29 is provided below the polycrystalline layer 28, and ohmic contacts 30 are provided for both of the layers 27 and 28.

As is apparent from the above description, the isolation diffusion process which is not efficient in practice can be entirely eliminated in accordance with the present invention, and the insulation resistances between each of the circuit elements produced on the same wafer can also be substantially improved over that of the conventional PN junction type isolation diffusion layer.

Although the invention has been described with reference to a preferred embodiment thereof, it will be apparent that various modifications may be made such as to apply an acceptor impurity on the silicon dioxide layer before the N-type layer is grown thereon for the purpose of improving the insulation resistance. Or, on the surface of the P-type substrate, from where the silicon dioxide was removed as described before, an $N^+$ diffusion layer may be formed before the growing of the epitaxial layer, and this $N^+$ diffusion layer may be employed as a buried layer.

Furthermore, instead of the above described silicon dioxide, silicon monoxide, silicon nitride, some of the glasses, metals, or the like may be applied, or the corresponding portion of the silicon substrate may merely be roughened, for instance, by a diamond point for disturbing the growth of the monocrystalline layer.

We claim:

1. A method of manufacturing semiconductor devices, comprising the steps of;

a. providing an insulator film layer on a first conductivity type silicon substrate by forming a layer for developing a polycrystalline seeding site, b. selectively removing areas of said insulator film and allowing a closed path pattern insulator layer to remain on the substrate as a polycrystalline seeding site circumferentially enclosing an exposed area of the surface of the substrate and areas of the exposed surface of the substrate being disposed circumferentially of the closed path pattern of insulator film, c. heating the substrate with said closed path pattern defining a polycrystalline seeding site thereon in an atmosphere containing an epitaxial layer-forming substance and an impurity to impart a second conductivity type opposite to said first conductivity type to form on said substrate a layer consisting of low resistivity monocrystalline portions and a high resistivity polycrystalline portion simultaneously grown on the exposed surface areas of the substrate and the polycrystalline seeding site respectively so that the monocrystalline and polycrystalline portions interface and isolation is achieved between the adjacent monocrystalline portions by said polycrystalline portion and the impurity to impart said second conductivity type, at least the monocrystalline portions of said layer having a higher impurity concentration than that of said substrate, and d. effecting a diffusion with respect to each of said monocrystalline portions to form circuit elements therein, whereby said circuit elements are insulated from each other by boundaries between said monocrystalline portions and said polycrystalline portions, and said boundaries being substantially in registry with boundaries between the said exposed surface areas of the substrate and said polycrystalline seeding site.

* * * * *